(12) United States Patent
Okabe

(10) Patent No.: US 12,327,724 B2
(45) Date of Patent: Jun. 10, 2025

(54) VAPOR DEPOSITION DEVICE AND METHOD OF PRODUCING EPITAXIAL WAFER

(71) Applicant: Epicrew Corporation, Ohmura (JP)

(72) Inventor: Akira Okabe, Ohmura (JP)

(73) Assignee: Epicrew Corporation, Ohmura (JP)

( * ) Notice: Subject to any disclaimer, the term of this patent is extended or adjusted under 35 U.S.C. 154(b) by 247 days.

(21) Appl. No.: 18/109,904

(22) Filed: Feb. 15, 2023

(65) Prior Publication Data

US 2023/0203705 A1 Jun. 29, 2023

Related U.S. Application Data

(63) Continuation of application No. PCT/JP2021/022138, filed on Jun. 10, 2021.

(30) Foreign Application Priority Data

Sep. 28, 2020 (JP) ................................. 2020-162664

(51) Int. Cl.
*C30B 25/10* (2006.01)
*C30B 25/12* (2006.01)
(Continued)

(52) U.S. Cl.
CPC ........ *H01L 21/02532* (2013.01); *C30B 25/10* (2013.01); *C30B 25/12* (2013.01);
(Continued)

(58) Field of Classification Search
CPC ......... C30B 25/10; C30B 25/12; C30B 25/14; C30B 25/165; H01L 21/02576;
(Continued)

(56) References Cited

U.S. PATENT DOCUMENTS

2008/0219824 A1\* 9/2008 Newman ........... H01L 21/68735
414/744.5
2008/0220150 A1\* 9/2008 Merry ..................... C30B 25/14
427/314

(Continued)

FOREIGN PATENT DOCUMENTS

DE 102011007632 B3 2/2012
EP 0957185 A2 11/1999
(Continued)

OTHER PUBLICATIONS

Hitoshi Habuka, "Simulation of Si epitaxial film fabrication process (Feathers, deep, etc.), Numerical Simulation of Silicon Epitaxial Film Growth," Journal of the Vacuum Society of Japan, vol. 49, No. 9, 2006, pp. 525-529 w/English translation.

(Continued)

*Primary Examiner* — Robert M Kunemund
(74) *Attorney, Agent, or Firm* — DLA Piper LLP (US)

(57) ABSTRACT

A vapor phase growth system includes a process chamber that includes a susceptor lifting mechanism that raises and lowers the susceptor between a first position and a second position. With the susceptor in the first position, the top surface of the susceptor is above the bottom surface of the preheating ring, and a source gas distribution space with a predetermined height dimension is secured between the top surface of the susceptor and the bottom surface of a ceiling plate of the reaction vessel body. With the susceptor in the second position, the top surface of the susceptor is located below the bottom surface of a preheating ring, and a substrate loading/unloading space, which has a greater height dimension than that of the source gas distribution space, is secured between the top surface of the susceptor and the bottom surface of the preheating ring.

6 Claims, 13 Drawing Sheets

(51) Int. Cl.
*C30B 25/14* (2006.01)
*C30B 25/16* (2006.01)
*C30B 25/20* (2006.01)
*H01L 21/02* (2006.01)

(52) U.S. Cl.
CPC ............ *C30B 25/14* (2013.01); *C30B 25/165* (2013.01); *C30B 25/20* (2013.01); *H01L 21/02576* (2013.01); *H01L 21/02579* (2013.01); *H01L 21/0262* (2013.01); *H01L 21/02658* (2013.01)

(58) Field of Classification Search
CPC ........... H01L 21/02579; H01L 21/0262; H01L 21/0658; H01L 21/02532
See application file for complete search history.

(56) References Cited

U.S. PATENT DOCUMENTS

| | | | |
|---|---|---|---|
| 2012/0263875 A1 | 10/2012 | Brenninger et al. | |
| 2013/0180447 A1 | 7/2013 | Ohnishi | |
| 2014/0290573 A1* | 10/2014 | Okabe | C23C 16/4584 118/500 |

FOREIGN PATENT DOCUMENTS

| | | |
|---|---|---|
| JP | 2006-049503 A | 2/2006 |
| JP | 2007-294545 A | 11/2007 |
| JP | 2011-165948 A | 8/2011 |
| JP | 6068255 B2 | 1/2017 |
| WO | 00/34999 A2 | 6/2000 |
| WO | 2012/066752 A1 | 5/2012 |

OTHER PUBLICATIONS

Yokohama Nat. Univ., et al., "Numerical calculation of Silicon Epitaxial Growth Rate for 450mm ϕ Substrate," Proceedings of the 75$^{th}$ Fall Meeting of the Japan Society of Applied Physics, 19a-A19-1 w/English translation.
International Search Report dated Aug. 17, 2021 in counterpart International Application No. PCT/JP2021/022138 w/English translation.
Extended European Search Report dated Oct. 24, 2024, from counterpart European Patent Application No. EP 21871919.3.
Notice of Reasons for Refusal dated Jun. 25, 2024, of counterpart Japanese Patent Application No. 2020-162664, along with an English translation.
Office Action dated Dec. 2, 2024, from counterpart Taiwanese Application No. 110129140 with English Translation.
Office Action dated Feb. 7, 2025, from counterpart Korean Patent Application No. 10-2023-7004216.

* cited by examiner

VAPOR DEPOSITION DEVICE AND METHOD OF PRODUCING EPITAXIAL WAFER

TECHNICAL FIELD

This disclosure relates to a vapor phase growth system for growing vapor phase of a semiconductor single-crystal thin film on a main surface of a single-crystal substrate and a method of manufacturing an epitaxial wafer embodied using the device.

BACKGROUND

An epitaxial wafer obtained by forming a semiconductor single-crystal thin film on a single-crystal substrate, for example, a silicon epitaxial wafer obtained by forming a silicon single-crystal thin film ("thin film") on the surface of a silicon single-crystal substrate ("substrate") by a vapor phase growth method have been widely used in electronic devices such as bipolar ICs and MOS-ICs. For example, a single-wafer vapor phase growth system has become the mainstream in the production of an epitaxial wafer with a diameter of 200 mm or greater in place of batch processing of multiple wafers in recent years. In that method, a substrate is held horizontally rotating in a reaction vessel, and a thin film is formed by growing a vapor phase by supplying source gas from one end to the other of the reaction vessel in a substantially horizontal and unidirectional manner. It is also known that the thickness distribution of a semiconductor single-crystal layer formed on a substrate in a single-wafer vapor phase growth system is greatly affected by the temperature distribution within the main surface of the substrate. Especially, the thickness of the semiconductor single-crystal layer tends to vary toward the larger side at the peripheral edge of the substrate where temperature easily drops. To prevent this, it is a common practice in a single-wafer vapor phase growth system to provide a preheating ring around a susceptor to ensure even heating of the peripheral edge of the substrate.

In general, infrared radiation heating, high-frequency induction heating, or resistance heating is used to heat the substrate during the production of silicon epitaxial wafers, creating a cold wall environment in which the temperature of the reaction vessel is kept low, and the temperature of the silicon substrate and susceptor is increased.

In a single-wafer vapor phase growth system, source gas is usually supplied through a gas inlet port formed at one end of the reaction vessel via a gas supply pipe, and after flowing along the main surface of the substrate, the source gas is discharged through an outlet port at the other end of the vessel. When manufacturing epitaxial wafers using the system with this structure, it is known that increasing the velocity of the source gas along the main surface of the substrate is effective in increasing the growth rate of the silicon single-crystal thin films. For example, "Numerical Calculation of 450 mmφ Silicon Epitaxial Growth Rate": Proceedings of the 75th Fall Meeting of the Japan Society of Applied Physics (Fall 2014, Hokkaido University) 19a-A19-1 discloses that when a silicon epitaxial wafer is produced, the growth rate of a silicon single-crystal layer deposited on the substrate can be increased by increasing the relative velocity between the main surface of the substrate and the source gas by increasing the rotation speed of the susceptor.

In the experiment disclosed in "Numerical Calculation of 450 mmφ Silicon Epitaxial Growth Rate": Proceedings of the 75th Fall Meeting of the Japan Society of Applied Physics (Fall 2014, Hokkaido University) 19a-A19-1, the concentration and flow rate of the source gas supplied to the reaction vessel were set constant, and the results showed that the growth rate of the silicon single-crystal layer increased when the rotation speed of the susceptor was increased under the conditions. "Simulation of Si Epitaxial Thin Film Formation Process": Journal of the Vacuum Society of Japan, Vol. 49 (2006), pp. 525-529 also shows thermodynamically that in the above cold wall environment, as the gas phase temperature increases during the growth of a silicon single-crystal layer, the growth rate of the single-crystal layer decreases in the region where the transport rate of the source gas components is rate-limiting (i.e., the diffusion layer on the main surface of the substrate).

That is, the greater the gas velocity on the main surface of the substrate is increased, the more the heat transfer from the main surface of the substrate is accelerated, reducing the temperature of the main surface of the substrate as well as the thickness of the diffusion layer on the main surface of the substrate due to the increase of the gas velocity, and increasing the concentration gradient of the source gas components in the diffusion layer. These factors are considered to increase the efficiency of the chemical reaction that produces silicon single-crystals from the source gas and increase the growth rate of the silicon single-crystal layers.

It is considered effective to employ a structure with a reduced space height between the main surface of the substrate as the source gas distribution channel and the bottom surface of the ceiling plate of the reaction vessel to increase the flow velocity of source gas on the main surface of the substrate and the growth rate of a semiconductor single-crystal layer in a single wafer vapor phase growth system. Specifically, the above space height can be reduced by employing a structure in which the susceptor holding the substrate is positioned closer to the bottom surface of the ceiling plate of the reaction vessel in the height direction during the semiconductor single-crystal growth process.

The process of loading a substrate to a susceptor in a single-wafer vapor phase growth system is performed by inserting and removing a substrate transfer member between the preparation chamber formed outside the reaction vessel body and the space between the bottom surface of the ceiling plate of the reaction vessel and a set of the susceptor and preheating ring (as a source gas distribution space during the growth of a semiconductor single-crystal layer). However, a problem occurs when the distance between the susceptor and the bottom surface of the ceiling plate of the reaction vessel is reduced so that securing space for causing the substrate transfer member to enter and exit may be difficult.

It could therefore be helpful to provide a vapor phase growth system that can sufficiently secure a space for a substrate transfer member to move when loading/unloading a substrate to and from a susceptor, and a method of manufacturing an epitaxial wafer using the system even if a configuration is employed in which the space between the bottom surface of the ceiling plate of the reaction vessel and the set of susceptor and preheating ring is narrower.

SUMMARY

A vapor phase growth system grows vapor phase of a semiconductor single-crystal thin film on the main surface of a single-crystal substrate, and has a reaction vessel body having a gas inlet port formed on the first end side and a gas outlet port formed on the second end side in the horizontal direction. The system is configured such that the source gas is introduced through the gas inlet port into the main body of the reaction vessel to form a semiconductor single-crystal thin film, the source gas flows along the main surface of the single-crystal substrate, which is substantially horizontally and rotationally held in the inner space of the reaction vessel body, and then is discharged through the gas outlet port. A preheating ring is arranged to surround a susceptor.

The system further includes: a susceptor lifting mechanism for raising and lowering the susceptor between the first position and the second position, wherein in the first position, the top surface of the susceptor is positioned above the bottom surface of the preheating ring, and a source gas distribution space having a predetermined height dimension is defined between the top surface of the susceptor and the bottom surface of the ceiling plate of the reaction vessel body, and in the second position, the top surface of the susceptor is positioned below the bottom surface of the preheating ring, and a substrate loading/unloading space having a greater height dimension than that of the source gas distribution space is defined between the top surface of the susceptor and the bottom surface of the preheating ring; a substrate transfer member having a substrate holding portion at the front end of the substrate transfer member, in which the single-crystal substrate is held horizontally and loaded/unloaded; and a substrate transfer member driving unit, which reciprocates the substrate transfer member horizontally between a substrate loading/unloading position and a preparation position, where in the substrate loading/unloading position, with respect to the susceptor in the second position, the substrate holding portion is located immediately above the susceptor, and in the preparation position, the substrate holding portion is located in a preparation chamber formed outside the reactor vessel body.

A method of producing an epitaxial wafer includes the steps of: using the vapor phase growth system; and obtaining an epitaxial wafer by placing a single-crystal substrate on the susceptor in the reaction vessel with the susceptor in the second position, then raising the susceptor in which the single-crystal substrate is placed to the first position, distributing a source gas in the reaction vessel, and epitaxially growing a vapor phase of a semiconductor single-crystal thin film on the single-crystal substrate.

It is desirable that the first position be defined such that a height dimension of the source gas distribution space is greater than or equal to 5 mm and less than or equal to 15 mm. It is desirable that the first position be defined such that the main surface of the single-crystal substrate on the susceptor is aligned with the top surface of the preheating ring.

The direction of distribution of the source gas can be determined such that the side where the preparation chamber is provided is the first end of the reaction vessel body, and the side opposite the preparation chamber with respect to the rotation axis of the susceptor is the second end of the vessel body. In this example, a portion in the inner space of the reaction vessel body located between the preheating ring and the preparation chamber shutter, which partitions the inner space from the preparation chamber and can open and close the preparation chamber, is defined as a gas passage. In this example, the gas passage may be provided in the form of a horizontally arranged partition plate with a height position determined such that the front edge of the plate faces the side surface of the preheating ring. The space above the partition plate of the gas passage defines an upper passage space 36A in communication with the source gas distribution space, and the space below the partition plate of the gas passage defines the lower passage space in communication with a system arrangement space below the preheating ring. The top surface of the partition plate may also be positioned to be aligned with the top surface of the preheating ring.

The susceptor, for example, is rotationally driven via a rotary shaft member with the upper end coupled to the bottom surface of the susceptor. In this example, the susceptor lifting mechanism is configured to raise and lower the susceptor along with the rotary shaft member.

A plurality of lift pins may be provided in the circumferential direction of the susceptor, with the lower end protruding downward from the susceptor, to lift up the single-crystal substrate in the form of pushing up the peripheral edge of the bottom surface of the single-crystal substrate on the susceptor from the bottom side. In this example, below the preheating ring in the reaction vessel body, a substrate lifting portion may be provided, including: lift pin driving arms provided corresponding to the lift pins, each of which has a lift pin biasing portion formed on a tip side of the arm to bias the corresponding lift pin upward from below; and a lift sleeve, which allows the rotation drive of the rotary shaft member, and is arranged outside the rotary shaft member coaxially and along the axis of the rotary shaft member where the base end of the lift pin driving arm is coupled to the lift sleeve.

The vapor phase growth system is configured to change the holding position of the susceptor in the height direction in the reaction vessel body by the susceptor lifting mechanism raising and lowering the susceptor. The position of the susceptor is changed so that the height dimension of the source gas distribution space defined between the main surface of the single-crystal substrate mounted on the susceptor and the bottom surface of the upper wall of the reaction vessel body can be changed stepwise or non-stepwise, allowing the adjustment of the flow velocity of the source gas when growing a semiconductor single-crystal layer on the single-crystal substrate, in turn allowing the adjustment of the semiconductor single-crystal layer.

A susceptor lifting mechanism raises and lowers the susceptor between the first position and the second position, where in the first position, the top surface of the susceptor is positioned above the bottom surface of the preheating ring, and a source gas distribution space having a predetermined height dimension is defined between the top surface of the susceptor and a bottom surface of a ceiling plate of the reaction vessel body, and in the second position, the top surface of the susceptor is positioned below the bottom surface of the preheating ring, and a substrate loading/unloading space having a greater height dimension than that of the source gas distribution space is defined between the top surface of the susceptor and the bottom surface of the preheating ring to load/unload a single-crystal substrate onto the susceptor in the second position by a substrate transfer member. This allows sufficient space below the preheating ring for the substrate transfer member to move to and from the susceptor when loading/unloading the substrate to and from the susceptor even if a configuration with a narrower space between the bottom surface of the ceiling plate of the reaction vessel and a set of the susceptor and preheating ring is employed.

DESCRIPTION OF THE REFERENCE NUMERALS

1: Process Chamber
2: Reaction Vessel Body
5: Interior Space
5P: Source Gas Distribution Space
5T: Substrate Loading/Unloading Space
7: Discharge Pipe
9: Susceptor
9A: Sleeve
9B: Spot Facing
11: Infrared Heat Lamp
12: Substrate Lift Portion Lifting Mechanism
12A: Lift Pin Driving Arm
12B: Lift Sleeve
12C: Lift Pin Biasing Portion
13: Lift Pin
14: Insertion Hole
15: Rotary Shaft Member
15A: Shaft Body
15B: Thermocouple
15C: Coupling Pin
15D: Susceptor Supporting Arm
20: Substrate Lift Portion
21: Gas Outlet Port
22: Gas Inlet Port
32: Preheating Ring
34: Partition Plate
36: Gas Passage
36A: Upper Passage Space
36B: Lower Passage Space
39: Susceptor Lifting Mechanism
40: Motor
41, 42: Air Cylinder
100: Vapor Phase Growth System
105a: Substrate Transfer Member
105H: Substrate Holding Portion
EL: Silicon Single-Crystal Thin Film
EW: Silicon Epitaxial Wafer
PP: First Position
PS: Second Position
O: Rotation Axis
PP: Main Surface
W: Silicon Single-Crystal Substrate DETAILED DESCRIPTION The following is a description of an example of my systems and methods with reference to the accompanying drawings.

Figure 1:
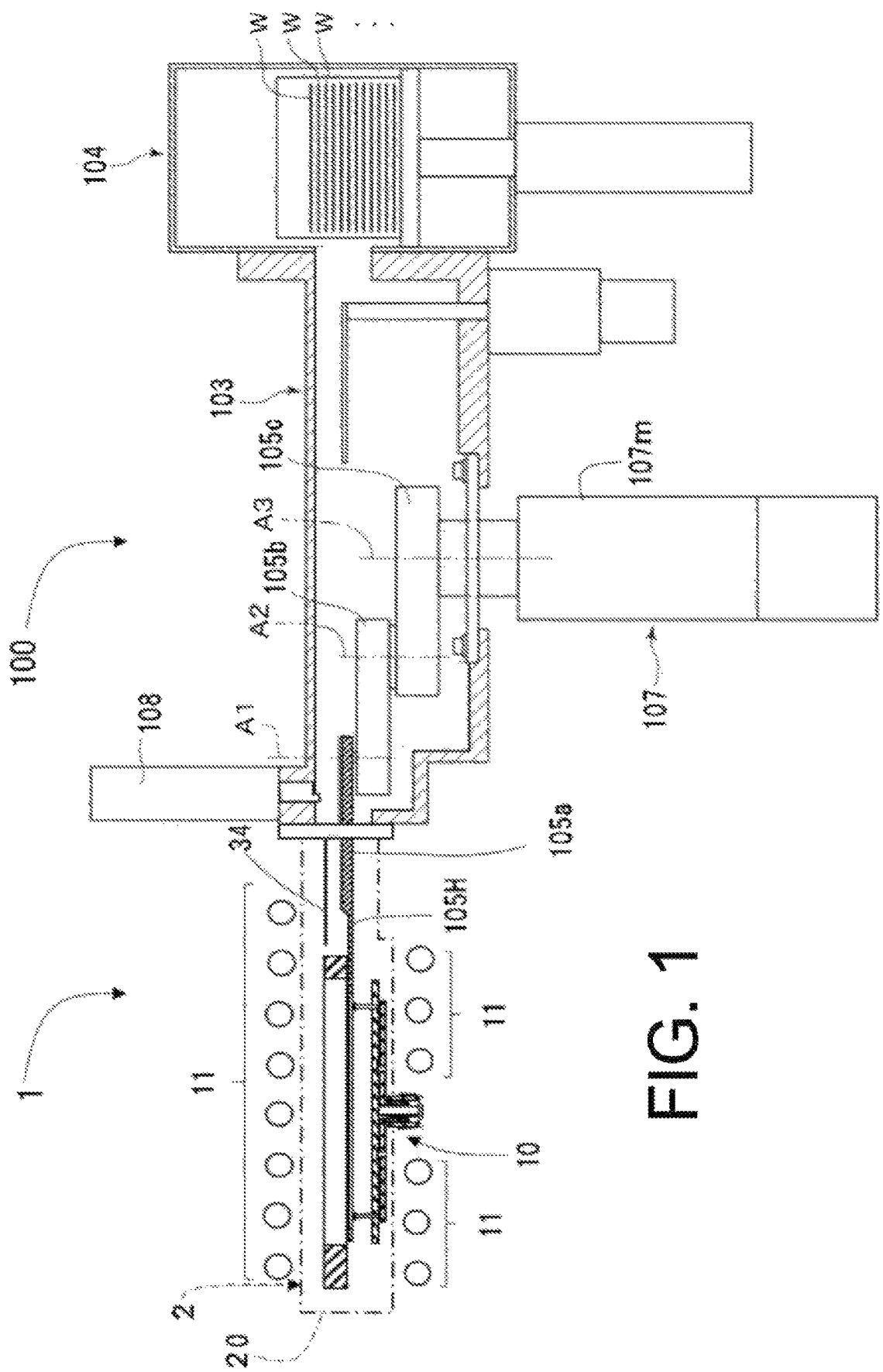
FIG. 1 is a schematic diagram illustrating an example of an overall configuration of a vapor phase growth system.
Figure 3:
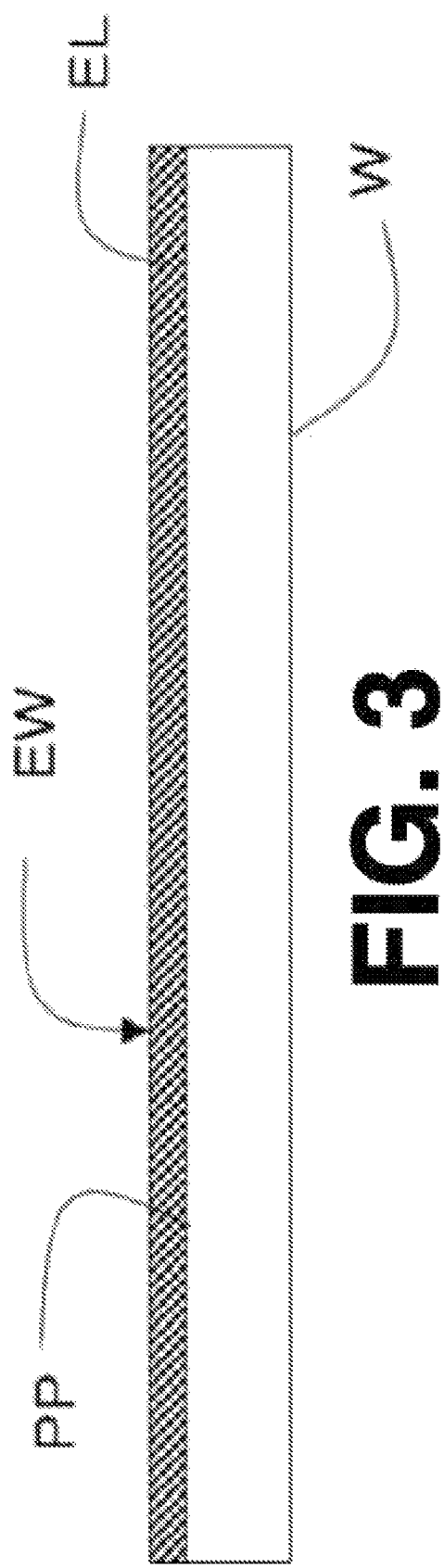
FIG. 3 is a schematic diagram illustrating a silicon epitaxial wafer.

FIG. 1 is a schematic side cross-sectional view illustrating an example of a vapor phase growth system. As shown in FIG. 3, a vapor phase growth system 100 is used to grow a vapor phase of a silicon single-crystal thin film EL on the main surface (top surface) PP of a silicon single-crystal substrate W ("substrate W") to produce a silicon epitaxial wafer EW. As shown in FIG. 1, a vapor phase growth system 100 includes a process chamber 1 for growing a vapor phase of a silicon single-crystal thin film EL on each substrate W, a preparation chamber 103 for transferring the substrates W inside the process chamber 1 (the inner space defines the preparation chamber), and a load lock chamber 104 coupled to the preparation chamber 103. The preparation chamber 103 is located between a reaction vessel body 2 and the load lock chamber 104.

Inside the preparation chamber 103 is a transfer robot 107 for transferring the substrates W between the load lock chamber 104 and the process chamber 1 alternatively. The transfer robot 107 includes a plurality of robot arms 105a, 105b, and 105c, which form a link mechanism. The robot arms 105a, 105b, and 105c are rotationally coupled to each other about corresponding individual rotation axes A1, A2, and A3, and the robot arm 105c is driven by a motor 107m to rotate such that the terminal robot arm 105a as the substrate transfer member ("substrate transfer member 105a) is driven forward and rearward in a horizontal direction. A substrate holder 105H is provided at the tip end of the substrate transfer member 105a. A substrate is placed on the top surface of the substrate holder 105H, and the substrate transfer member 105a advances and retracts in that state to transfer the substrate. That is, the transfer robot 107 serves as a substrate transfer member driving unit, which reciprocates the substrate transfer member 105a in the horizontal direction between the substrate attachment/removal position where the substrate holding portion 105H is positioned immediately above the susceptor 9 positioned at a second position (FIG. 2: PS) described below and the preparation position where the substrate holding portion 105H is positioned inside the preparation chamber formed outside the reaction vessel body 2.

A preparation chamber shutter 108 (L-shaped gate valve) can be opened and closed in the portion of the preparation chamber 103 that is connected to the reaction vessel body 2 to ensure airtightness between the reaction vessel body 2 and the preparation chamber 103. The load lock chamber 104 is used to store multiple substrates W in a stacked state.

Figure 2:
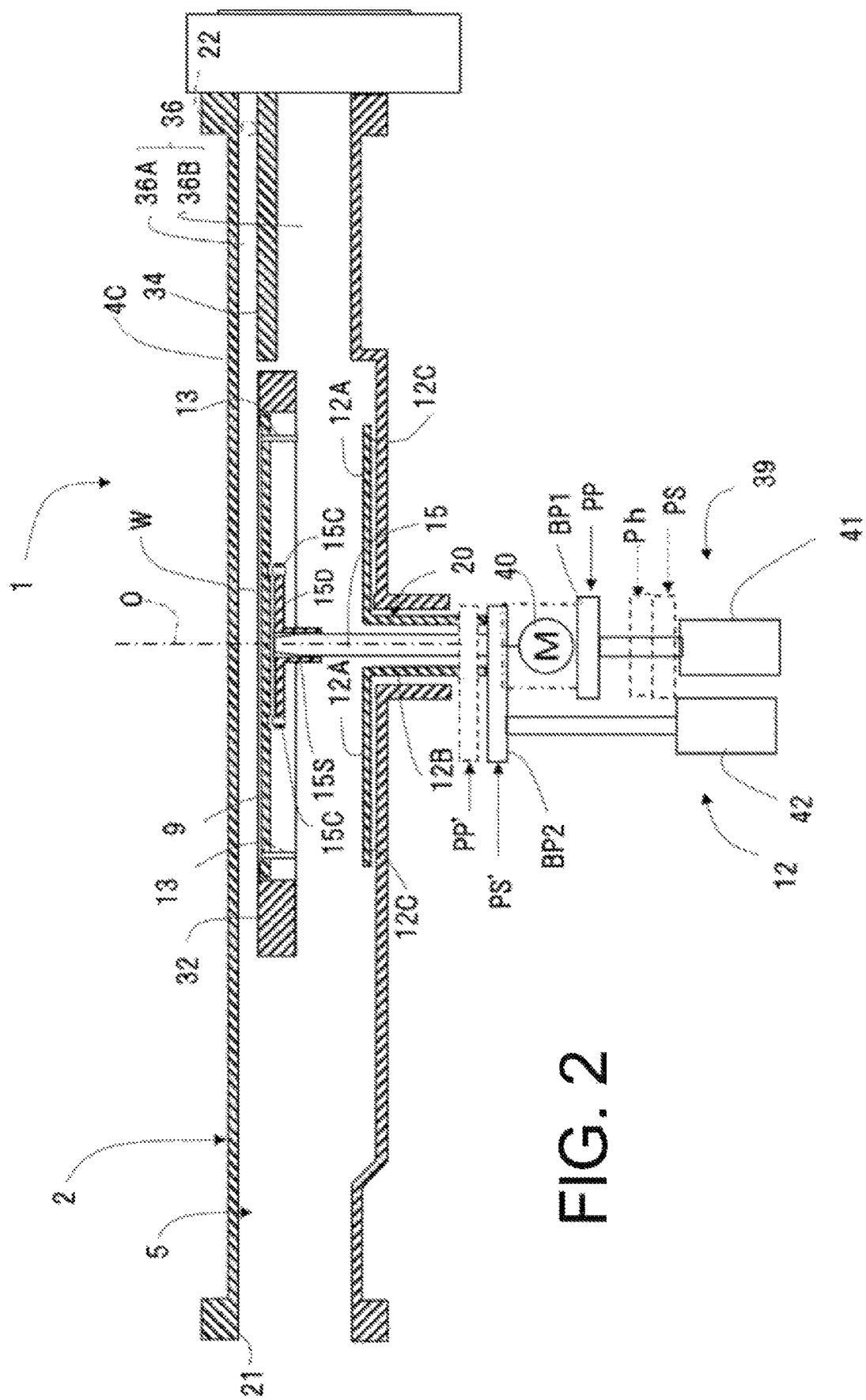
FIG. 2 is a side cross-sectional view illustrating a process chamber.

FIG. 2 illustrates a detailed structure of the process chamber 1. The process chamber 1 has a reaction vessel body 2 with a gas inlet port 22 on the first end side and a gas outlet port 21 on the second end side in the horizontal direction. The source gas G for producing a thin film is configured to be introduced into the reaction vessel body 2 through the gas inlet port 22, flow along the main surface of the substrate W, which is substantially horizontally and rotationally held in the inner space 5 of the reaction vessel body 2, and then be discharged through the gas outlet port 21. The entire reaction vessel body 2 is made of quartz and metallic materials such as stainless steel as well as other internal components.

In FIG. 2, in the inner space 5 of the reaction vessel body 2, a disk-shaped susceptor 9 rotationally driven by a motor 40 about a vertical rotation axis O is arranged, and only one substrate W for producing the silicon epitaxial wafer EW in FIG. 3 is placed within a shallow spot facing 9B (see FIG. 4) formed in the top surface of the susceptor 9. That is, the process chamber 1 is configured as a horizontal single-wafer vapor phase growth system. The substrate W is, for example, 100 mm or greater in diameter. In addition, As shown in FIG. 1, infrared heating lamps 11 for heating substrates are arranged at predetermined intervals at the top and bottom of the reaction vessel body 2, corresponding to the area where the substrate W is placed. As shown in FIG. 2, a preheating ring 32 is arranged inside the reaction vessel body 2 to surround the susceptor 9.

The source gas G is used for growing the vapor phase of the silicon single-crystal thin film on the substrate W above and is selected from silicon compounds such as $SiHCl_3$, $SiCl_4$, $SiH_2Cl_2$, $SiH_4$, and $Si_2H_6$. The source gas G contains $B_2H_6$ or $PH_3$ as dopant gas and $H_2$, $N_2$ and Ar as dilution gas as appropriate. When performing substrate pretreatment (e.g., removal of natural oxide film and adhered organic matter) prior to the thin film vapor phase growth process, a pretreatment gas formed by diluting a corrosive gas appropriately selected from HCl, HF, $ClF_3$, and $NF_3$, for example, with a dilution gas is supplied into the reaction vessel body 2 or a high-temperature heat treatment is performed in the atmosphere of $H_2$.

Figure 5:
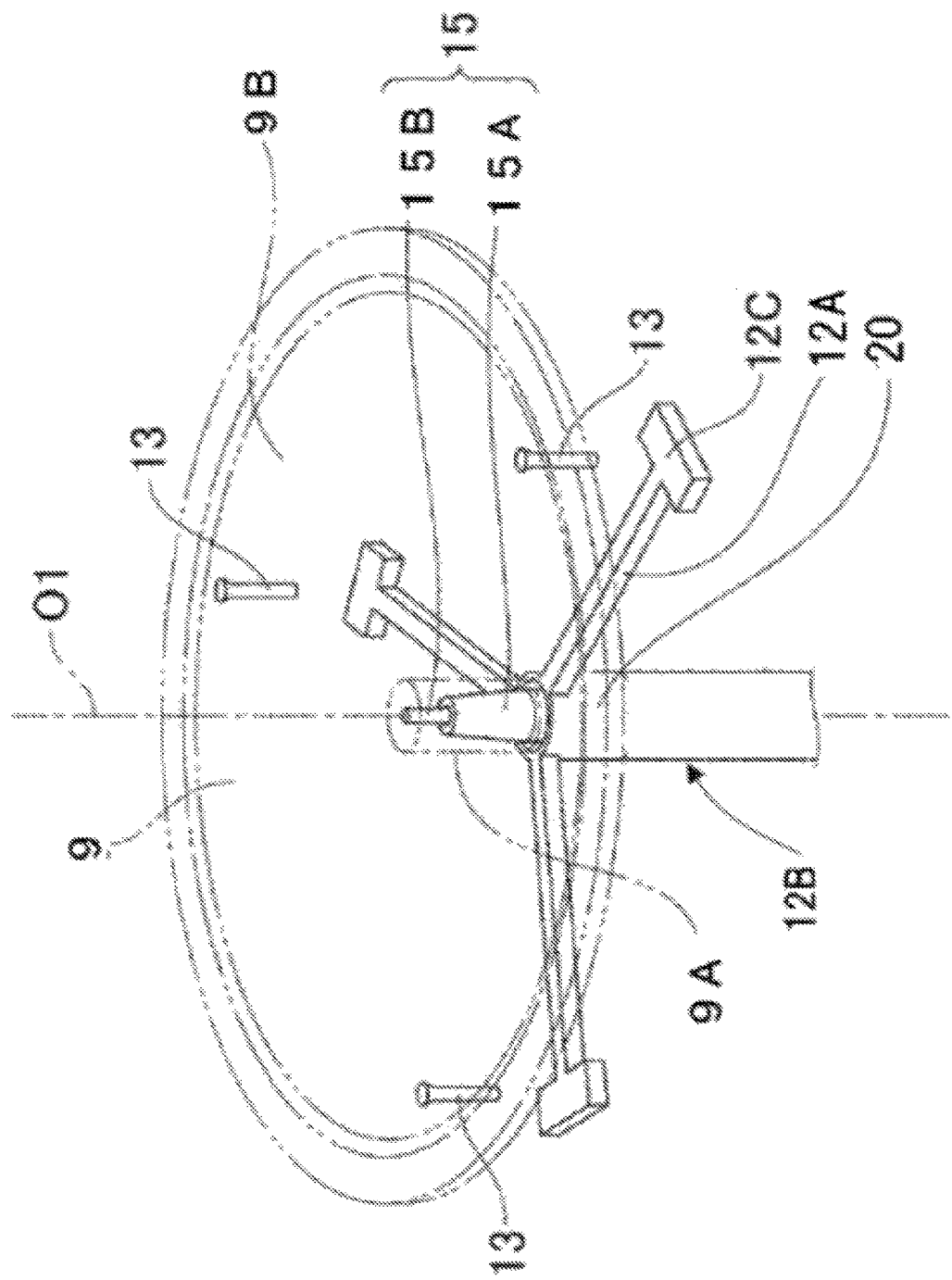
FIG. 5 is a perspective view illustrating a lifting portion of a lift pin in FIG. 4.

As shown in FIG. 2, the susceptor 9 is rotationally driven by the motor 40 via a rotary shaft member 15 with an upper end coupled to the lower surface of the susceptor 9. The tip end of the rotary shaft member 15 is coupled to the central region of the lower surface of the susceptor 9, and the base ends of a plurality of susceptor support arms 15D are coupled to the intermediate portion of the rotary shaft member 15 in the axial direction. The tip end of each susceptor support arm 15D extends horizontally in the radial direction of the susceptor 9, and is coupled to the bottom surface of the susceptor 9 by a coupling pin 15C. The coupling pin 15C serves as a spacer to form a minute gap (about 1 mm in this example) between the susceptor support arm 15D and the bottom surface of the susceptor 9. As shown in FIG. 5, the rotary shaft member 15 is configured by a shaft body 15A and a thermocouple 15B. The outer circumference of the upper end of the shaft body 15A has a tapered surface with a smaller diameter at the tip end. The upper end of the reduced diameter of the shaft body 15A is fitted into the cylindrical sleeve15S without relative rotation (in FIG. 5, the susceptor support arm 15D and coupling pin 15C are omitted).

The process chamber 1 includes a susceptor lifting mechanism 39, which raises and lowers the susceptor 9 between the first position PP and the second position PS shown in FIG. 2 (in FIG. 2, although the positions PP, PS, and Ph represent the positions of the base material BP1, in the following description, they are assumed to represent the positions of the susceptor 9). With the susceptor 9 in the first position PP, the top surface of the susceptor 9 is above the bottom surface of the preheating ring 32, and a source gas distribution space 5P (see FIG. 13) with a predetermined height dimension is secured between the top surface of the susceptor 9 and the bottom surface of the ceiling plate of the reaction vessel body 2. The first position PP above is defined such that the height dimension of the source gas distribution space 5P to be secured is a relatively narrow value greater than or equal to 5 mm and less than or equal to 15 mm (in this example, about 10 mm).

In contrast, with the susceptor 9 in the second position PS, the top surface of the susceptor 9 is located below the bottom surface of the preheating ring 32, and a substrate loading/unloading space 5T (see FIGS. 9 to 12), which has a greater height dimension than that of the source gas distribution space 5P, is secured between the top surface of the susceptor 9 and the bottom surface of the preheating ring 32.

The susceptor lifting mechanism 39 is configured to raise and lower the susceptor 9 along with the rotary shaft member 15 (and the motor 40), and in this example, the lift driving unit is configured by an air cylinder 41 (or an electric cylinder). The tip end of the cylinder rod of the air cylinder 41 is coupled to the susceptor assembly including the rotary shaft member 15 and the motor 40 via the base material BP1.

In this example, the air cylinder 41 is configured with a three-position cylinder so that the height position of the susceptor 9 can be switched among the first position PP, the second position PS, and the reference position Pm, which is located between the first position PP and second position PS. The first position PP of the susceptor 9 is defined such that the main surface of the substrate W on the susceptor 9 is aligned with the top surface of the preheating ring 32. The top surface of the preheating ring 32 is aligned with the main surface of the silicon single-crystal substrate W on the susceptor 9, generating no step between the main surface of the substrate W and the preheating ring 32 and effectively suppressing turbulence in the source gas flow when passing through them.

Figure 13:
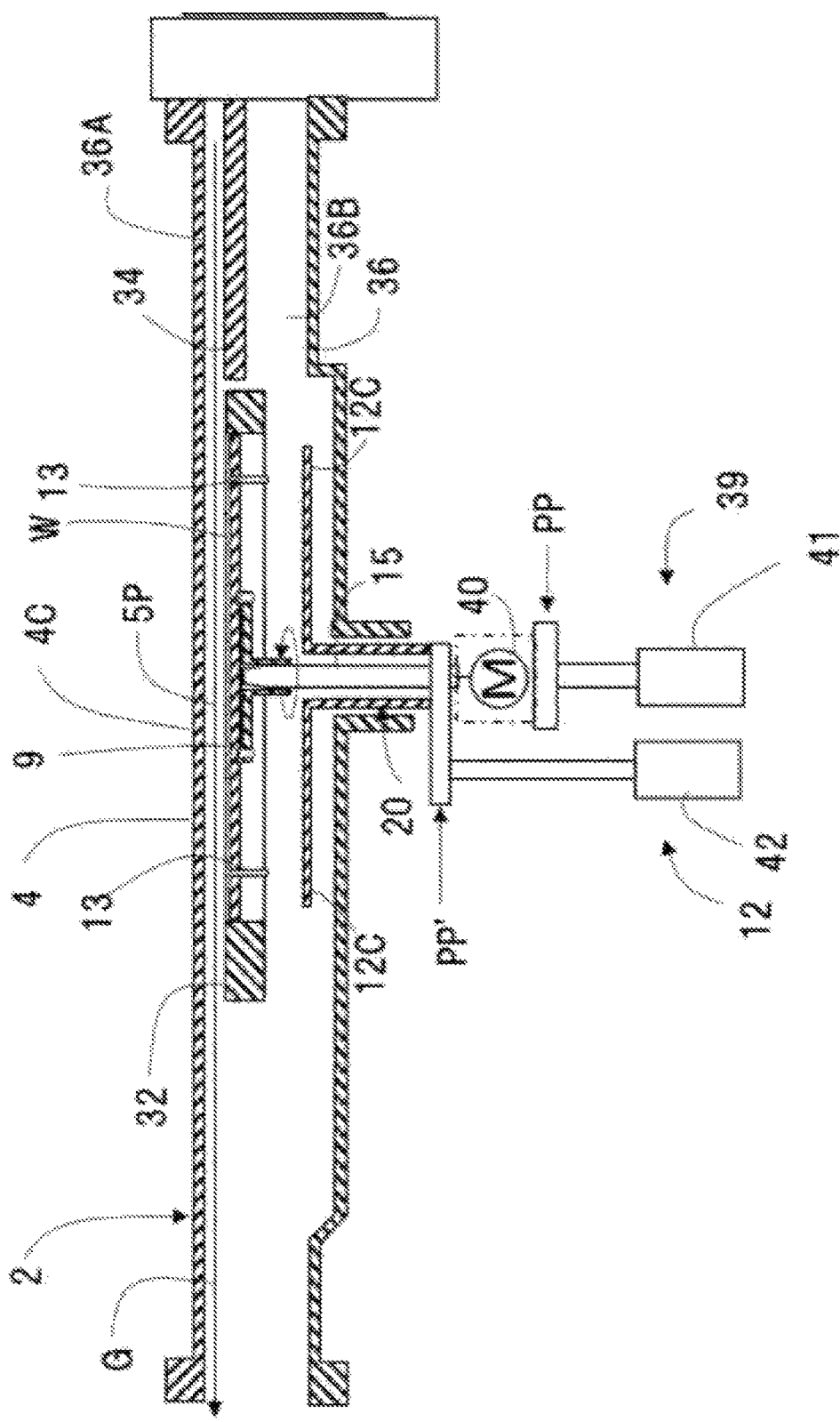
FIG. 13 is a sixth diagram illustrating the operation of the vapor phase growth system shown in FIG. 1.

In FIG. 2, a gas passage 36 is formed on the gas inlet port 22 side of the reaction vessel body 2. The partition plate 34 with the height position determined such that the front edge of the plate faces the side of the preheating ring 32 is positioned horizontally in the gas passage 36 (the periphery of the partition plate 34 can be fixed, for example, to the inner surface of the side wall forming the gas passage 36). The space above the partition plate 34 in the gas passage 36 corresponds to the upper passage space 36A, which is in communication with the source gas distribution space 5P (see FIG. 13). The space below the partition plate 34 in the gas passage 36 corresponds to the lower passage space 36B, which is in communication with the device arrangement space below the preheating ring 32. The partition plate 34 is provided, as shown in FIG. 13, to allow the source gas G to flow along the main surface of the substrate W in the source gas distribution space 5P without being disturbed by the vortex flow, for example, which runs from the peripheral side of the preheating ring 32 to the lower side of the preheating ring 32, allowing the thickness of the resulting silicon single-crystal film to be more even.

As shown in FIG. 2, the top surface of the partition plate 34 is defined to be aligned with the top surface of the preheating ring 32 in this example. This eliminates a step between the preheating ring 32 and the partition plate 34, effectively suppressing the turbulence in the source gas flow as it passes through them.

Figure 4:
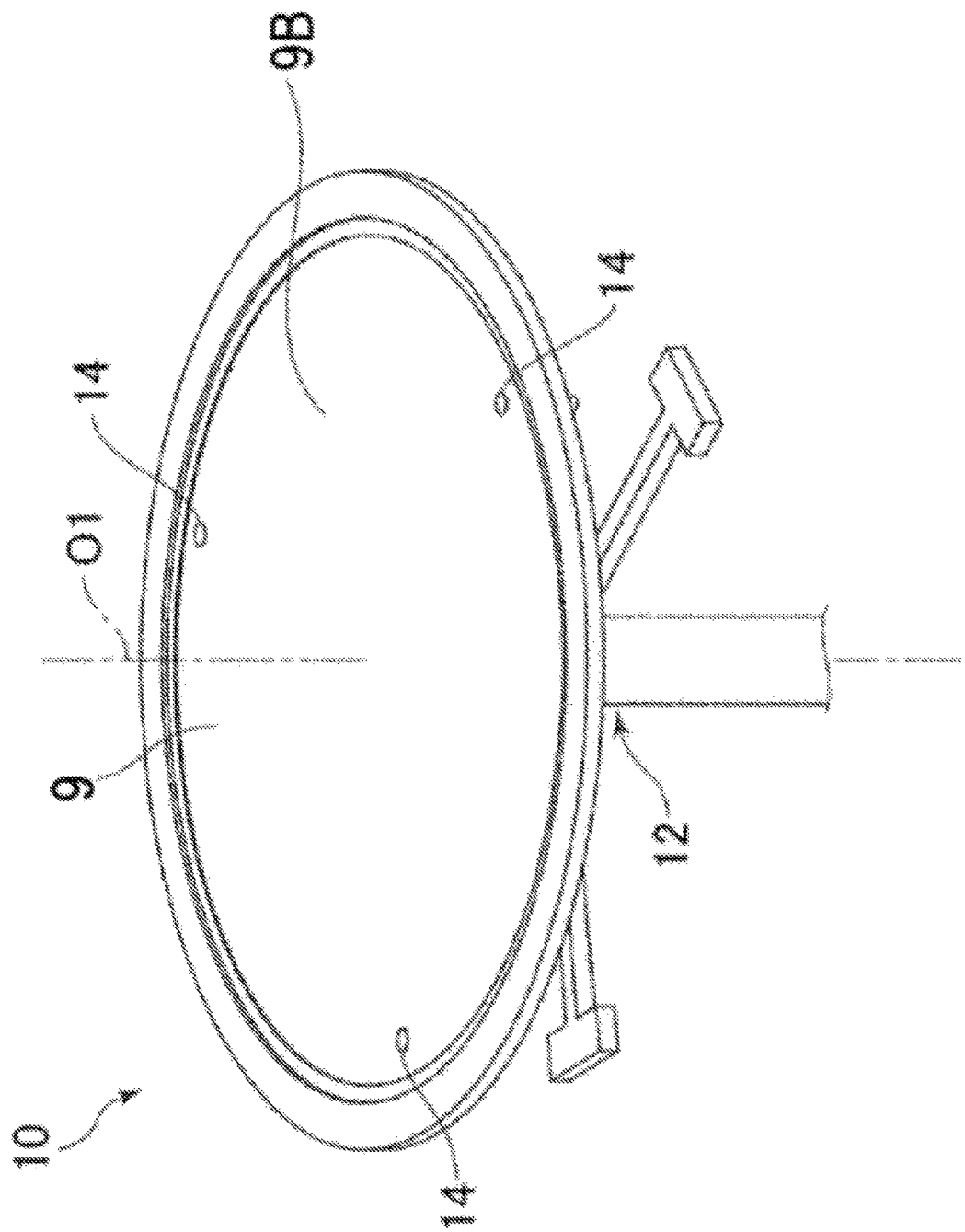
FIG. 4 is a perspective view illustrating an example of a lifting portion of a susceptor in the vapor phase growth system shown in FIG. 1.

Next, a plurality of lift pins 13 are provided on the peripheral edge of the susceptor 9. The lift pins 13 are used to lift up the substrate W by pushing up the peripheral edge of the bottom surface of the substrate W from the bottom side with the bottom end of each protruding downward from the susceptor 9. Specifically, as shown in FIG. 4, in the peripheral edge of the bottom portion of the spot facing 9B of the susceptor 9, a plurality of lift pin insertion holes 14 are formed from the top to the bottom therethrough in the circumferential direction. As shown in FIG. 5, the spot facing is configured such that the upper end of each lift pin 13 has a greater diameter head than that of the base end, and the upper end of each insertion hole 14 in FIG. 4 corresponds to a diameter expanded to be in accordance with the head of the lift pin 13. The bottom surface of the head of the lift pin 13 contacts the bottom surface of the insertion hole 14 in the spot facing, preventing the lift pin from falling out of the susceptor 9.

As shown in FIG. 2, the substrate lift portion 20 (finger wafer lift) is located below the preheating ring 32. As shown in FIG. 5, the substrate lift portion 20 is configured by a lift sleeve 12B and a plurality of lift pin driving arms 12A with base ends coupled to the lift sleeve 12B. Each lift pin driving arm 12A is provided in accordance with the corresponding lift pin 13, and a lift pin biasing portion 12C is formed on the tip side of each lift pin driving arm 12A to apply upward force to the lift pin 13 from below. In this example, three lift pin drive arms 12A are arranged at equal angular intervals about the central axis of susceptor 9, each extending horizontally in the radial direction of the susceptor 9 from the lift sleeve 12B. The lift pin biasing portion 12C, which forms the tip end of each lift pin driving arm 12A, is wider than the portion including the base end of the lift pin driving arm 12A, and formed as a lift plate facing the lower end surface of the lift pin 13 and the lower side. The lift sleeve 12B is cylindrical and can be raised and lowered integrally with the lift pin drive arms 12A coaxially outside the rotary shaft member 15 and along the axis O1 of the rotary shaft member 15, while allowing the rotary drive of the rotary shaft member 15.

As shown in FIG. 2, the substrate lift portion 20 is driven up and down by the substrate lift portion lifting mechanism 12 between the raised position PP' and lowered position PS' (in FIG. 2, the positions PP' and PS' represent the position of the base material BP2, but hereinafter, they are described as representing the position of the substrate lift portion 20). In this example, the lift driving unit is configured by an air cylinder 42 (or an electric cylinder). The tip end of the cylinder rod of the air cylinder 42 is coupled to the lift sleeve 12B via the base material BP2.

When the lift sleeve 12B approaches relative to the bottom surface of the susceptor 9 along the rotary shaft member 15, the lift pins 13 are biased upward by the lift pin biasing portions 12C of the lift pin driving arms 12A. The substrate W on the susceptor 9 is then pushed up from the bottom side by the lift pins 13 to be lifted up, allowing the substrate W to be easily collected after the silicon single-crystal thin film is formed.

Figure 6:
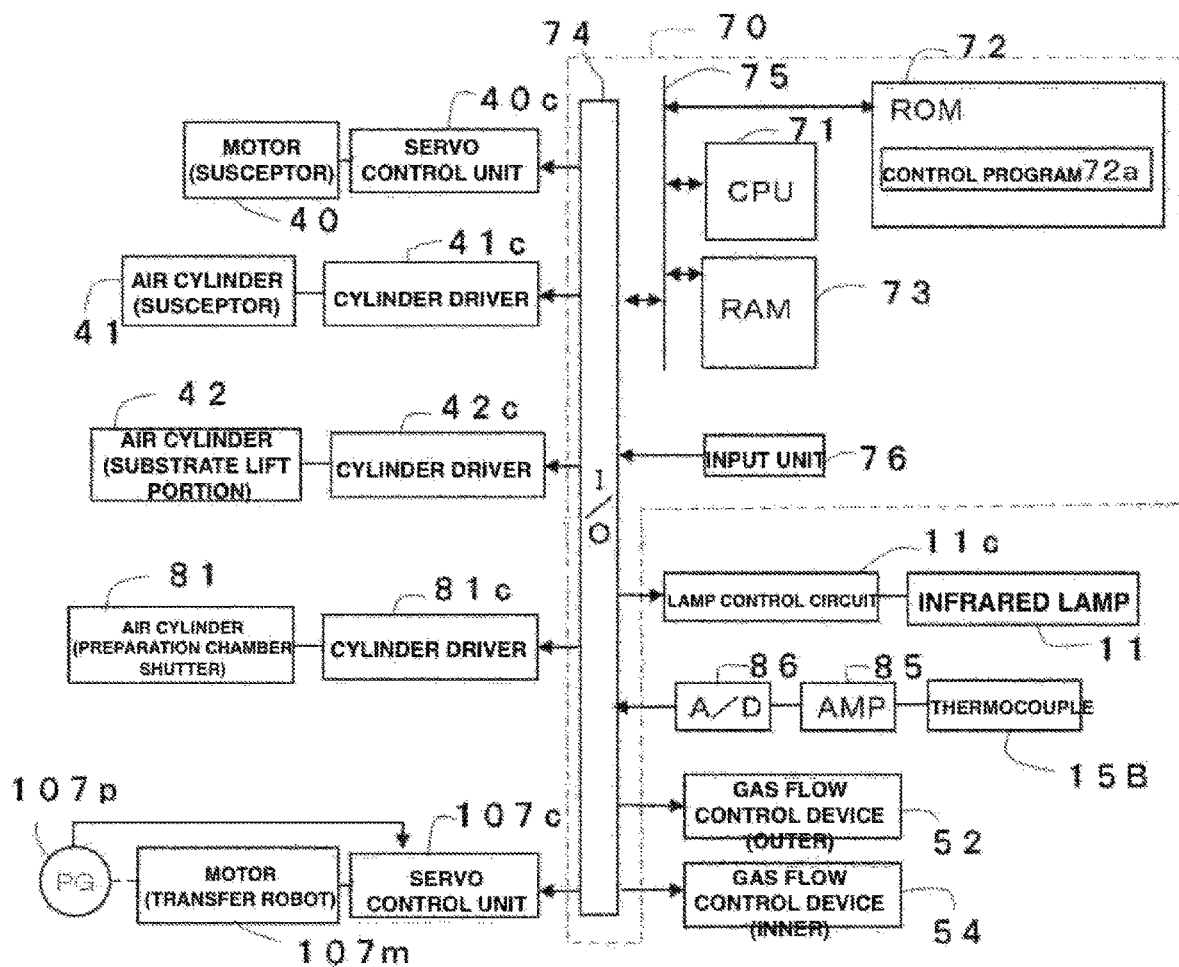
FIG. 6 is a block diagram illustrating a control system of the vapor phase growth system shown in FIG. 1.

Hereinafter, an example of a control form of the process chamber 1 will be described. FIG. 6 is a block diagram illustrating the electrical configuration of the control system of the vapor phase growth system 100. The control system is configured in the form of a control computer 70 as the control entity. The control computer 70 is configured by a CPU 71, a ROM 72 (program storage unit) that stores a control program 72a, a RAM 73 that serves as work memory when the CPU 71 executes the control program 72a, and an input/output unit 74 that electrically inputs and outputs control information, all interconnected by an internal bus 75 (data bus+address bus).

The driving elements of the process chamber 1 shown in FIG. 1 are connected to the control computer 70 as described below. The infrared heating lamp 11 is connected to the I/O unit 74 via a lamp control circuit 11c. The thermocouple (temperature sensor) 15B for detecting the substrate temperature is connected to the I/O unit 74. The gas flow control devices 52 and 54 both have flow detection units and built-in valves (not shown), and are connected to the I/O unit 74 to receive instructions from the control computer 70 and control the source gas on each pipe continuously variable by the built-in valves above.

The motor 40, which drives the susceptor 9, is connected to the I/O unit 74 via a servo control unit 40c. The servo control unit 40c monitors the rotation speed of the motor 40 and controls the driving such that the rotation speed of the motor 40 (and, in turn, the susceptor 9) is maintained constant by referring to the rotation speed indication values from the control computer 70.

The air cylinder 41, which raises and lowers the susceptor 9, is connected to the I/O unit 74 via a cylinder driver 41c, and the air cylinder 42, which raises and lowers the substrate lift portion 20, is connected to the I/O unit 74 via the cylinder driver 42c. In addition, a motor 107m (FIG. 1), which drives the transfer robot 107, is connected to the I/O unit 74 via a servo control unit 107c. The servo control unit 107c grasps the position of the substrate transfer member 105a on the basis of the pulse input from a pulse generator 40p (rotation sensor) attached to the output shaft of the motor 107m, receives drive command information from the control computer 70, and controls its driving.

Referring to the flowchart in FIG. 7 and the operation illustrations in FIGS. 8 through 13, the operation of the vapor phase growth system 100 controlled by the control program 72a will be described below. In step S101 of FIG. 7, with the start of execution of the control program 72a, the air cylinders 41 and 42 (FIG. 6) are activated to move the susceptor 9 to the reference position Ph shown in FIG. 8 and the substrate lift portion 20 (finger wafer lift "FWL" in FIG. 7) to the raised position PP'. The reference position Ph of the susceptor 9 and the raised position PP' of the substrate lift portion 20 are defined such that the distance between the bottom surface of the susceptor 9 and the lift pin biasing portions 12C of the substrate lift portion 20 is shorter than the protrusion length of the lift pins 13 from the bottom surface of the susceptor 9. Accordingly, the lift pins 13 are biased upward by the substrate lift portion 20 and protrude from the top surface of the susceptor 9. During this, in FIG. 1, the substrate W is transferred from the load lock chamber 104 into the preparation chamber 103 and mounted on the substrate holding portion 105H of the substrate transfer member 105a.

Figure 7:
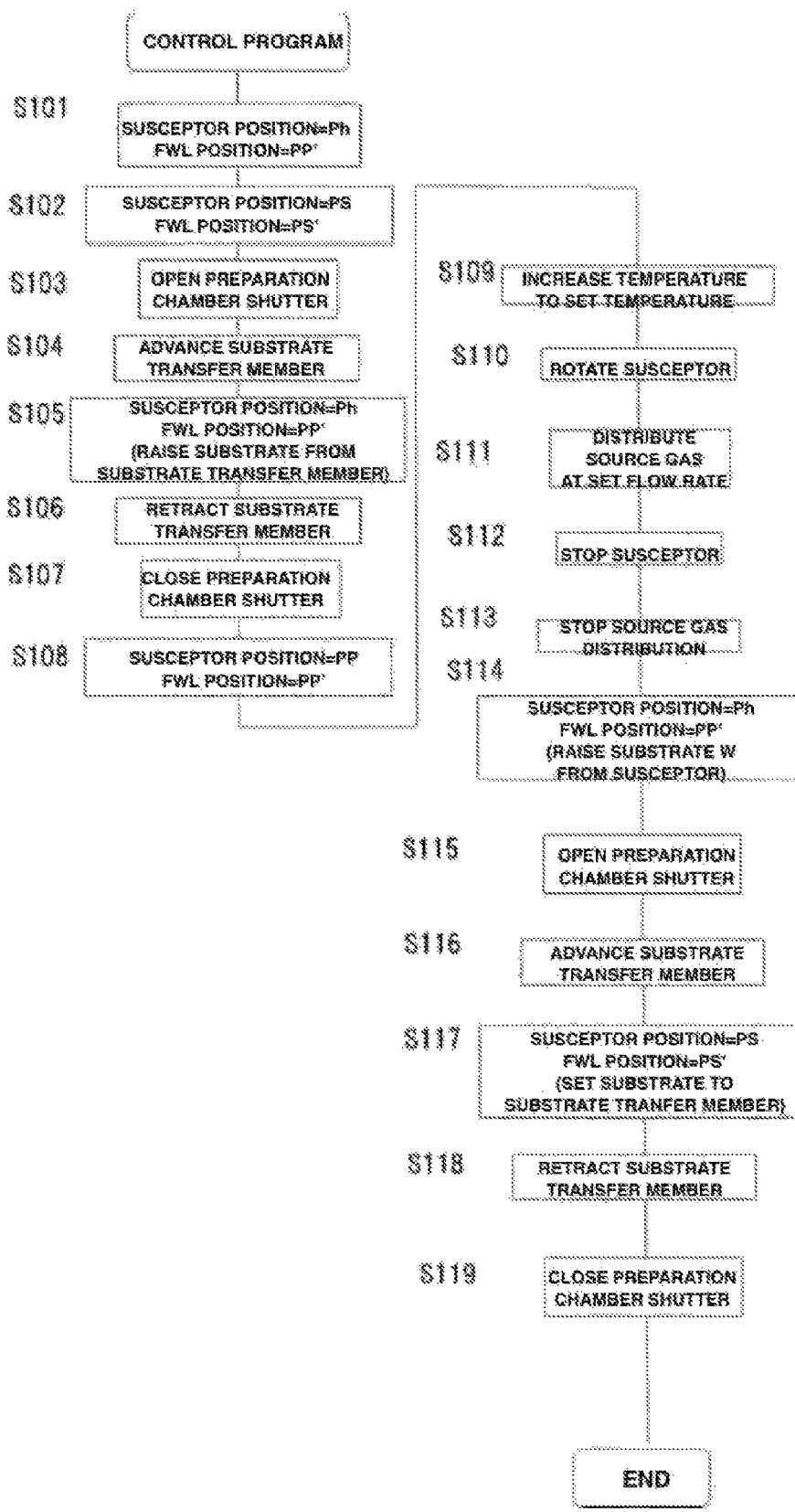
FIG. 7 is a flowchart illustrating an example of a processing flow of a control program in the control system shown in FIG. 6.
Figure 8:
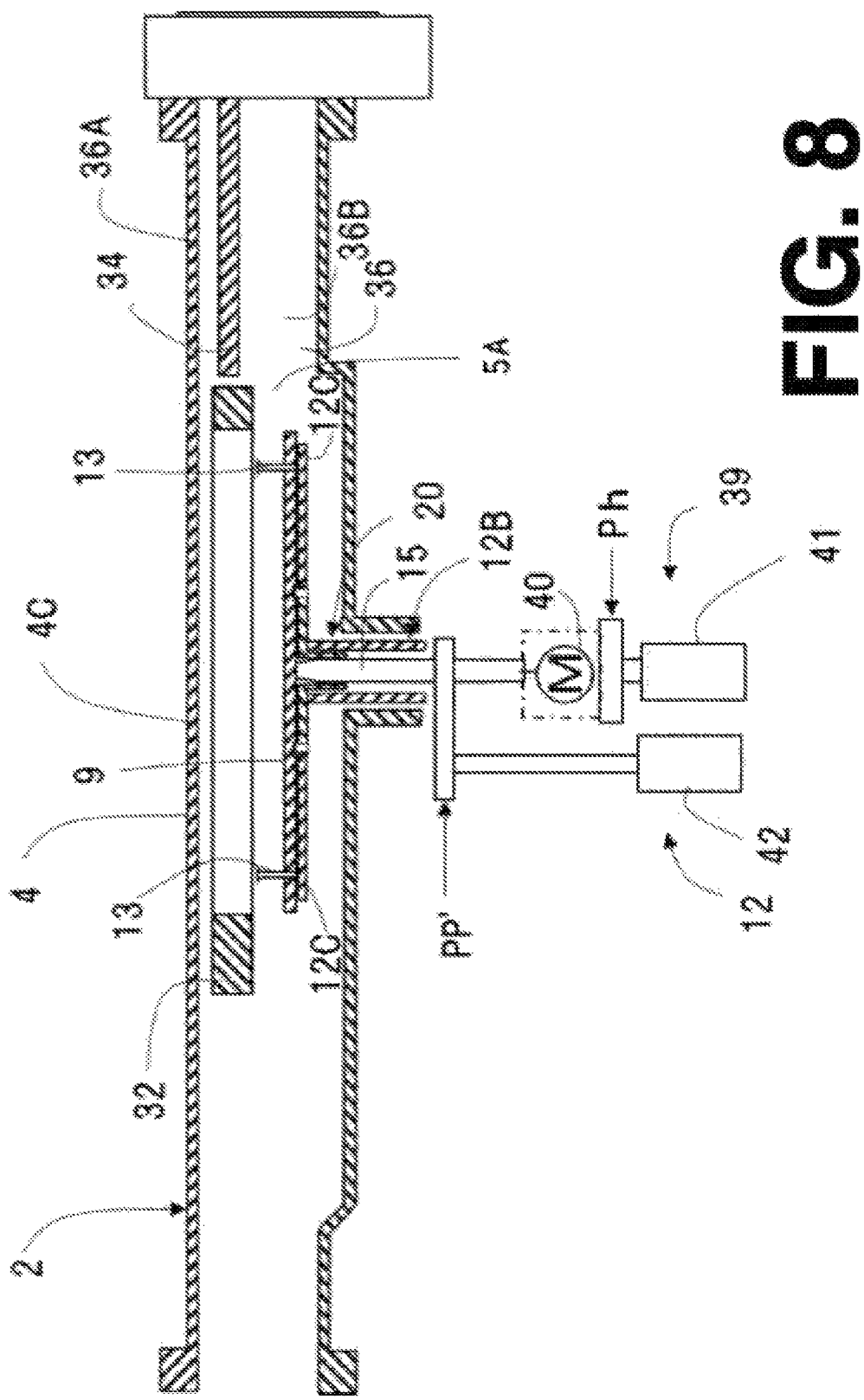
FIG. 8 is a first diagram illustrating an operation of the vapor phase growth system shown in FIG. 1.
Figure 9:
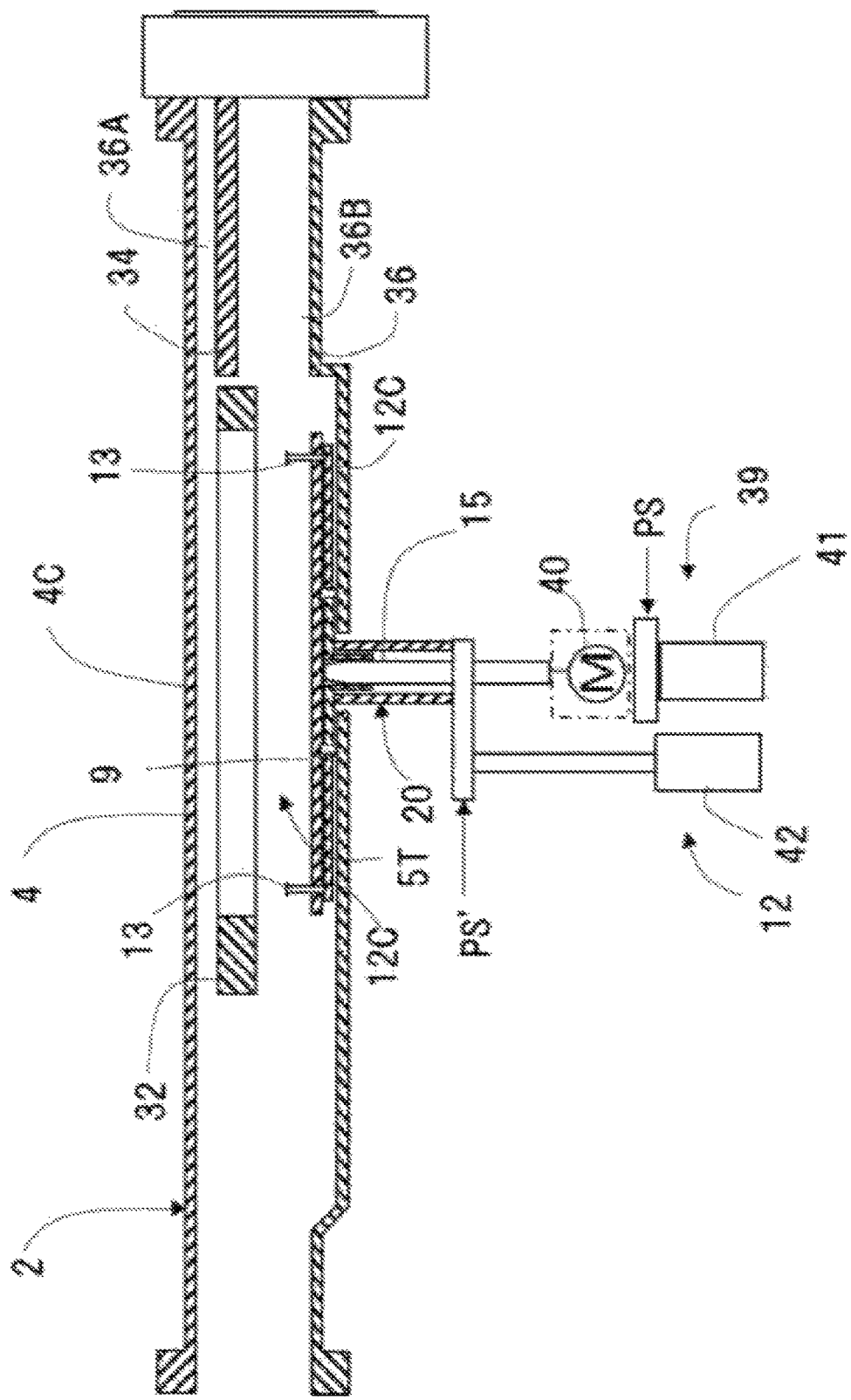
FIG. 9 is a second diagram illustrating the operation of the vapor phase growth system shown in FIG. 1.

Next, in step S102 of FIG. 7, the air cylinders 41, 42 (FIG. 2) are activated to move the susceptor 9 to the second position PS and the substrate lift portion 20 to the lowered position PS' as shown in FIG. 9. The susceptor 9 and substrate lift portion 20 are integrally lowered with the lift pins 13 protruding from the top surface of the susceptor 9, and a gap or the substrate loading/unloading space 5T is secured between the lift pins 13 and the bottom surface of the preheating ring 32 to receive the substrate transfer member 105a.

Figure 10:
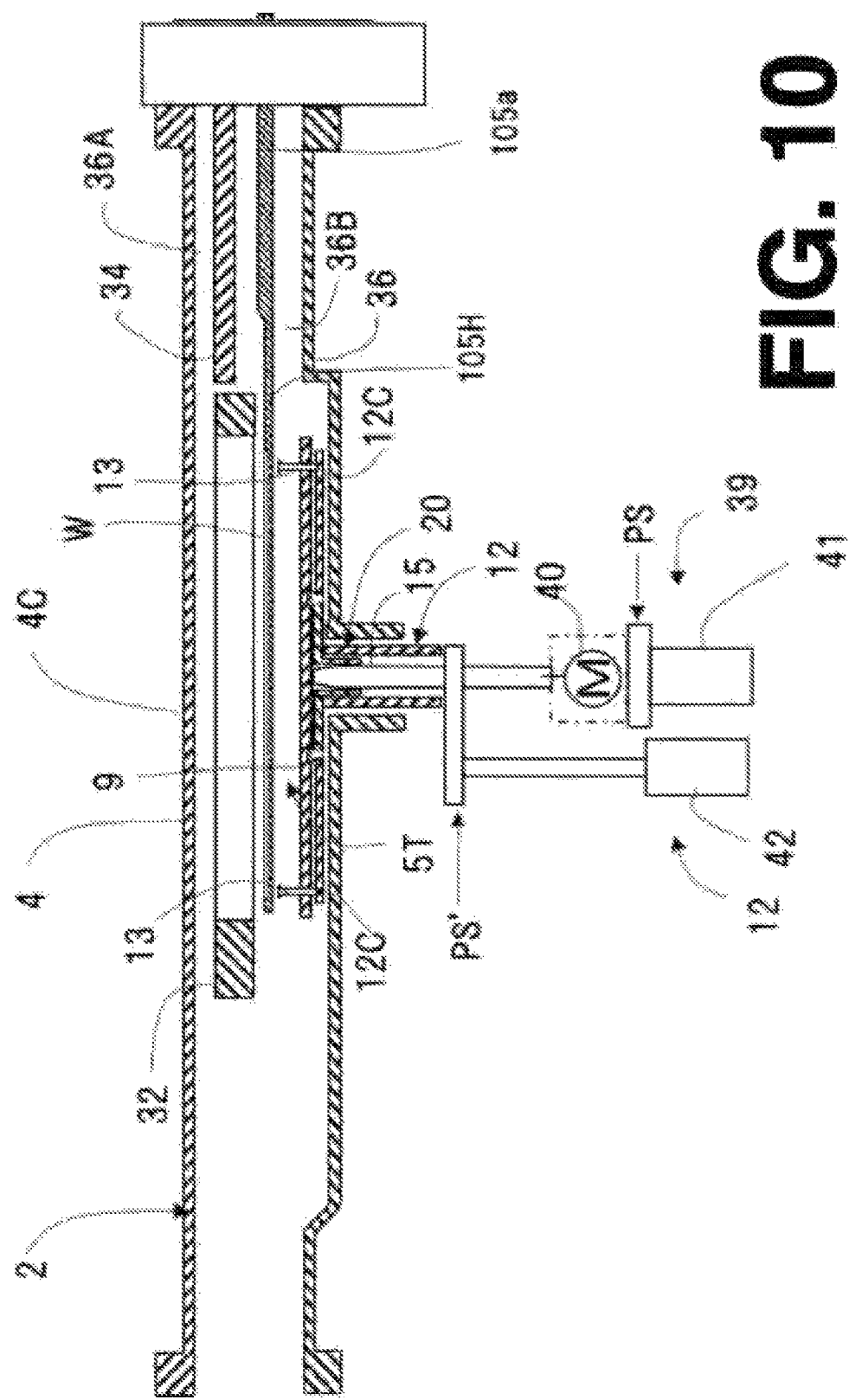
FIG. 10 is a third diagram illustrating the operation of the vapor phase growth system shown in FIG. 1.

In this state, in step S103 of FIG. 7, an air cylinder 81 (FIG. 6) is driven to open the preparation chamber shutter 108 (FIG. 1). Then, in step S104, the motor 107m (FIG. 1) is driven to advance the substrate transfer member 105a with the substrate W mounted thereon. This allows, as shown in FIG. 10, the substrate holding portion 105H of the substrate transfer member 105A to enter the substrate loading/unloading space 5T along with the substrate W. At this time, a gap is formed between the top ends of the lift pins 13 and the bottom surface of the substrate holding portion 105H, and between the top surface of the substrate holding portion 105H and the bottom surface of the preheating ring 32, respectively. In this example, the size of the gaps is all set to about 3.5 mm.

Figure 11:
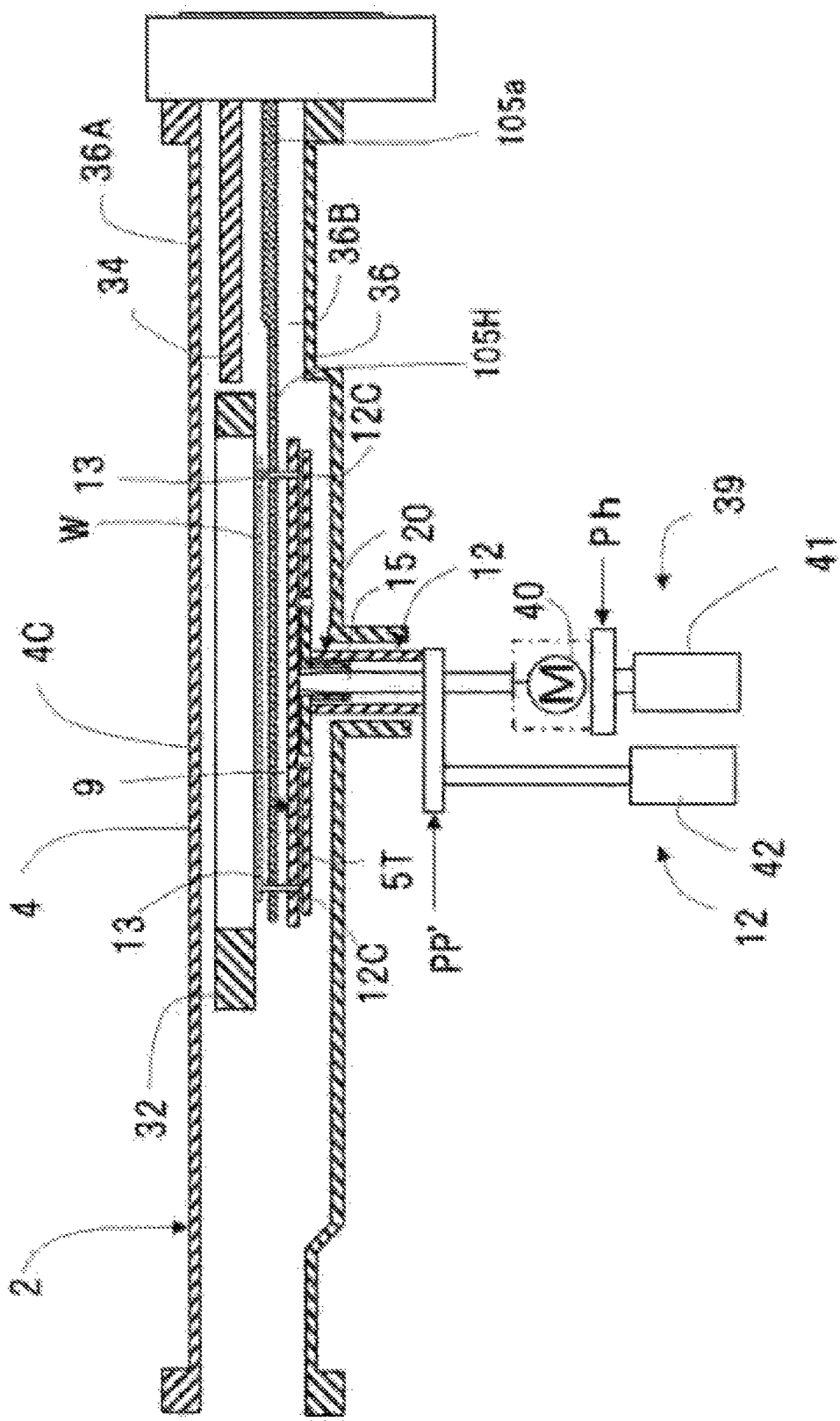
FIG. 11 is a fourth diagram illustrating the operation of the vapor phase growth system shown in FIG. 1.

Then, in step S105 of FIG. 7, the air cylinders 41 and 42 (FIG. 2) are activated to return the susceptor 9 to the reference position Ph and the substrate lift portion 20 to the raised position PP' as shown in FIG. 11. The susceptor 9 and substrate lift portion 20 are raised integrally with the lift pins 13 protruding from the top surface of the susceptor 9. The raised lift pins 13 contact the back surface of the substrate W that is exposed from the substrate holding portion 105H, and the substrate W is lifted up to the top of the substrate holding portion 105H.

Figure 12:
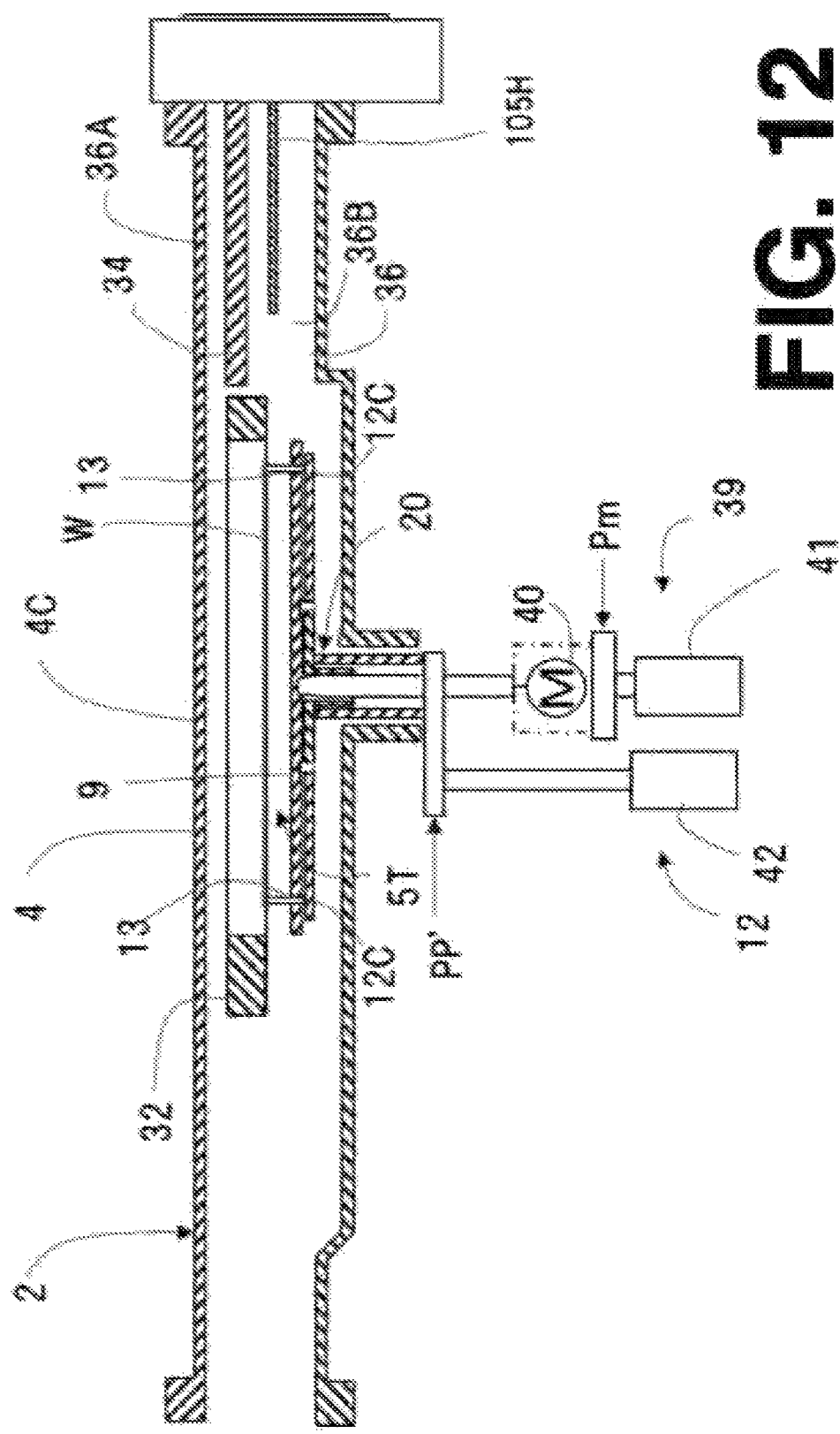
FIG. 12 is a fifth diagram illustrating the operation of the vapor phase growth system shown in FIG. 1.

Returning to FIG. 7, in step S106, the motor 107m (FIG. 1) is driven to retract the substrate transfer member 105a with the substrate W detached as shown in FIG. 12. If the retraction of the substrate transfer member 105a is completed, the process proceeds to step S107 and the air cylinder 81 (FIG. 6) is driven to close the preparation chamber shutter 108 (FIG. 1). The process then proceeds to step S108 to activate the air cylinder 41 (FIG. 2) to lift only the susceptor 9 to the first position PP as shown in FIG. 13. Since the height position of the substrate lift portion 20 is maintained and the lift pins 13 are stationary, the top surface of the susceptor 9 approaches the back surface of the substrate W, which is supported by the upper ends of the lift pins 13, and the substrate W is stuck in the spot facing 9B (FIG. 4). This mounts the substrate W on the susceptor 9 and the main surface of the substrate W is aligned with the top surface of the preheating ring 32. The height dimension of the source gas distribution space 5P is secured to a relatively narrow value greater than or equal to 5 mm and less than or equal to 15 mm (about 10 mm in this example).

Next, in step S109, the infrared heating lamp 11 is activated to increase the temperature in the inner space 5 to a set temperature. In step S110, the susceptor 9 is started to be rotationally driven, and in step S111, the source gas is started to be circulated at a predetermined set flow rate. This deposits a silicon single-crystal layer on the substrate W.

At this time, as shown in FIG. 13, the growth rate of a silicon single-crystal layer on the substrate W is increased since the height dimension of the source gas distribution space 5P is directed to a narrow value as described above, improving the production efficiency. In addition, since the susceptor 9 approaches the infrared heating lamp 11, the rate of temperature increase is increased when the substrate W is heated to the target temperature, thereby shortening the heating sequence. The increase in the gas filling rate of the source gas distribution space 5P also contributes to the improvement in the rate of the temperature increase of the substrate W. If the height dimension of the source gas distribution space 5P exceeds 15 mm, the effect of improving the growth rate of the silicon single-crystal layers may be insufficient. In contrast, if the height dimension of the source gas distribution space 5P is below 5 mm, the distribution resistance of the source gas to the source gas distribution space 5P may be excessive so that the flow velocity of the source gas may be difficult to be ensured.

The process chamber 1 is configured as a cold-wall type vapor phase growth system. When employing such a cold-wall type vapor phase growth system, Japanese Laid-Open Patent Publication No. 2011-165948 suggests that increasing the flow velocity of the source gas may suppress the accumulation of silicon deposits as reaction products on the inner wall of the quartz glass forming the reaction vessel body 2 during the epitaxial growth. On the basis of this configuration, the accumulation of the silicon deposits on the inner surface of the reaction vessel body 2 may also be advantageously restricted by reducing the height dimension of the source gas distribution space 5P and increasing the flow velocity of the source gas as shown in FIG. 13, for example. The above advantageous effect is expected to be particularly noticeable when conditions that tend to cause the accumulation of the silicon deposits are employed such as when $SiH_2Cl_2$ (dichlorosilane S) is used as the silicon source gas and epitaxial growth is performed at high temperatures (e.g., 1,150° C.) and reduced pressure (e.g., 60 Torr).

Returning to FIG. 7, if the film deposition is completed, the process proceeds to step S112 to stop the rotation of the susceptor 9. In step S113, the distribution of the source gas is stopped. In step S114, the susceptor 9 is moved to the reference position Ph by activating the air cylinders 41 and 42 (see FIG. 2), and the substrate lift portion 20 is moved to the raised position PP'. Then, as in FIG. 12, the lift pins 13 are raised and the substrate W is lifted up above the substrate holding portion 105H after the deposition is completed.

Then, in step S115 in FIG. 7, the air cylinder 81 (FIG. 6) is driven to open the preparation chamber shutter 108 (FIG. 1). In step S116, the motor 107m (FIG. 1) is driven to advance the empty substrate transfer member 105a (the same condition as in FIG. 11). In step S117, the air cylinders 41, 42 (FIG. 6) are activated to move the susceptor 9 to the second position PS in FIG. 2 and move the substrate lift portion 20 to the lower position PS'. The susceptor 9 and substrate lift portion 20 are lowered integrally with the lift pins 13 protruding from the top surface of the susceptor 9. This causes the state to be the same as that in FIG. 10 in which the substrate W after deposition, which have been supported by the upper ends of the lift pins 13, is set on the substrate holding portion 105H with its descent regulated by the substrate holding portion 105H. In contrast, the lift pins 13 are detached downward from the substrate W.

Then, in step S118 of FIG. 7, the motor 107m (FIG. 1) is driven to retract the substrate transfer member 105a with the substrate W set. This causes the deposited substrate W to be collected in the preparation chamber 103. In step S119, the air cylinder 81 (FIG. 6) is driven to close the preparation chamber shutter 108 (FIG. 1).

Examples are described above, but they are not limited to these described above. For example, a single-wafer system for manufacturing silicon epitaxial wafers by chemical vapor deposition (CVD) is illustrated as the process chamber 1, but the manufacturing object is not limited to the silicon epitaxial wafers. My concepts may also be applied to a system for epitaxial growth of a compound semiconductor single-crystal layer on a single-crystal substrate such as sapphire and silicon by metal-oxide vapor phase epitaxy (MOVPE).

INCORPORATION BY REFERENCE

This application is a continuation application of International Application No. PCT/JP2021/022138, filed on Jun. 10, 2021, which claims priority of Japanese (JP) Patent Application No. 2020-162664, filed on Sep. 28, 2020, the contents of which are hereby incorporated by reference in its entirety.

What is claimed is:
1. A vapor phase growth system that grows a semiconductor single-crystal thin film on a main surface of a single-crystal substrate, comprising:
a reaction vessel body including a gas inlet port on a first end side and a gas outlet port on a second end side in a horizontal direction, wherein the reaction vessel body is configured such that the single-crystal substrate is substantially horizontally and rotationally held on a disk-shaped susceptor, which is rotated and driven in an inner space of the reaction vessel body, and a source gas that forms a semiconductor single-crystal thin film is introduced into the reaction vessel body through the gas inlet port, flows along the main surface of the single-crystal substrate, and then discharged through the gas outlet port, and a preheating ring is arranged to surround the susceptor;

a susceptor lifting mechanism that raises and lowers the susceptor between a first position and a second position, wherein in the first position, a top surface of the susceptor is positioned above a bottom surface of the preheating ring, and a source gas distribution space having a predetermined height dimension is defined between the top surface of the susceptor and a bottom surface of a ceiling plate of the reaction vessel body, and in the second position, the top surface of the susceptor is positioned below the bottom surface of the preheating ring, and a substrate loading/unloading space having a greater height dimension than that of the source gas distribution space is defined between the top surface of the susceptor and the bottom surface of the preheating ring, wherein the susceptor is rotationally driven via a rotary shaft member with an upper end coupled to a lower surface of the susceptor, and the susceptor lifting mechanism raises and lowers the susceptor along with the rotary shaft member, and wherein a plurality of lift pins are provided in a circumferential direction of the susceptor, with a lower end protruding downward from the susceptor, to lift up the single-crystal substrate in a form of pushing up a peripheral edge of a bottom surface of the single-crystal substrate on the susceptor from a bottom side, and below the preheating ring in the reaction vessel body, a substrate lifting portion may be provided, including: lift pin driving arms provided corresponding to the lift pins, each of which has a lift pin biasing portion formed on a tip side of the arm to bias the corresponding lift pin upward from below; and a lift sleeve that allows a rotation drive of the rotary shaft member, and is arranged outside the rotary shaft member coaxially and along an axis of the rotary shaft member where the base end of the lift pin driving arm is coupled to the lift sleeve;

a substrate transfer member having a substrate holding portion at a front end of the substrate transfer member, wherein the single-crystal substrate is loaded and unloaded in a form of being held horizontally;

a substrate transfer member driving unit that reciprocates the substrate transfer member horizontally between a substrate loading/unloading position and a preparation position, wherein in the substrate loading/unloading position, with respect to the susceptor positioned in the second position, the substrate holding portion is positioned immediately above the susceptor, and in the preparation position, the substrate holding portion is positioned in a preparation chamber formed outside the reaction vessel body; and wherein after the retraction horizontally the preparation position of the substrate transfer member with the single-crystal substrate detached is completed, only the susceptor is raised to the first position out of the susceptor and the substrate lifting portion.

2. The vapor phase growth system according to claim 1, wherein the first position is defined such that a height dimension of the source gas distribution space is greater than or equal to 5 mm and less than or equal to 15 mm.

3. The vapor phase growth system according to claim 1, wherein the first position is defined such that the main surface of the single-crystal substrate on the susceptor is aligned with a top surface of the preheating ring.

4. The vapor phase growth system according to claim 1, wherein:

a direction of distribution of the source gas is determined such that a side where the preparation chamber is provided is the first end and a side opposite to the preparation chamber with respect to a rotation axis of the susceptor is the second end of the reaction vessel body, and a portion in the inner space of the reaction vessel body between a preparation chamber shutter and the preheating ring serves as a gas passage, wherein the preparation chamber shutter partitions the space from the preparation chamber in an openable and closable manner, and the gas passage includes a partition plate horizontally positioned at a height position determined such that a front edge of the plate faces a side of the preheating ring, a space above the partition plate in the gas passage defines an upper passage space in communication with the source gas distribution space, and a space below the partition plate of the gas passage defines a lower passage space in communication with a system arrangement space below the preheating ring.

5. The vapor phase growth system according to claim 4, wherein a top surface of the partition plate is set to be aligned with a top surface of the preheating ring.

6. A method of manufacturing an epitaxial wafer comprising:

using a vapor phase growth system that grows a semiconductor single-crystal thin film on a main surface of a single-crystal substrate, the vapor phase growth system comprising: a reaction vessel body including a gas inlet port on a first end side and a gas outlet port on a second end side in a horizontal direction, wherein the reaction vessel body is configured such that the single-crystal substrate is substantially horizontally and rotationally held on a disk-shaped susceptor, which is rotated and driven in an inner space of the reaction vessel body, and a source gas that forms a semiconductor single-crystal thin film is introduced into the reaction vessel body through the gas inlet port, flows along the main surface of the single-crystal substrate, and then discharged through the gas outlet port, and a preheating ring is arranged to surround the susceptor; a susceptor lifting mechanism that raises and lowers the susceptor between a first position and a second position, wherein in the first position, a top surface of the susceptor is positioned above a bottom surface of the preheating ring, and a source gas distribution space having a predetermined height dimension is defined between the top surface of the susceptor and a bottom surface of a ceiling plate of the reaction vessel body, and in the second position, the top surface of the susceptor is positioned below the bottom surface of the preheating ring, and a substrate loading/unloading space having a greater height dimension than that of the source gas distribution space is defined between the top surface of the susceptor and the bottom surface of the preheating ring, wherein the susceptor is rotationally driven via a rotary shaft member with an upper end coupled to a lower surface of the susceptor, and the susceptor lifting mechanism raises and lowers the susceptor along with the rotary shaft member, and wherein a plurality of lift pins are provided in a circumferential direction of the susceptor, with a lower end protruding downward from the susceptor, to lift up the single-crystal substrate in a form of pushing up a peripheral edge of a bottom surface of the single-crystal substrate on the susceptor from a bottom side, and below the preheating ring in the reaction vessel body, a substrate lifting portion may be provided, including: lift pin driving arms provided corresponding to the lift pins, each of which has a lift pin biasing portion formed on a tip side of the arm to bias the corresponding lift pin upward from below; and a lift sleeve that allows a rotation drive of the rotary shaft member, and is arranged outside the rotary shaft member coaxially and along an axis of the rotary shaft member where the base end of the lift pin driving arm is coupled to the lift sleeve;

a substrate transfer member having a substrate holding portion at a front end of the substrate transfer member, wherein the single-crystal substrate is loaded and unloaded in a form of being held horizontally; and a substrate transfer member driving unit that reciprocates the substrate transfer member horizontally between a substrate loading/unloading position and a preparation position, wherein in the substrate loading/unloading position, with respect to the susceptor positioned in the second position, the substrate holding portion is positioned immediately above the susceptor, and in the preparation position, the substrate holding portion is positioned in a preparation chamber formed outside the reaction vessel body;

wherein after the retraction horizontally the preparation position of the substrate transfer member with the single-crystal substrate detached is completed, only the susceptor is raised to the first position out of the susceptor and the substrate lifting portion;

obtaining an epitaxial wafer by placing the single-crystal substrate on the susceptor in the reaction vessel with the susceptor in the second position, raising the susceptor in which the single-crystal substrate is placed to the first position, distributing the source gas in the reaction vessel, and epitaxially growing a vapor phase of the semiconductor single-crystal thin film on the single-crystal substrate.

\* \* \* \* \*